United States Patent [19]

Van Ruyven et al.

[11] Patent Number: 4,644,553
[45] Date of Patent: Feb. 17, 1987

[54] SEMICONDUCTOR LASER WITH LATERAL INJECTION

[75] Inventors: Lodewijk J. Van Ruyven, Eindhoven, Netherlands; Ferd E. Williams, deceased, late of Newark, Del., by Anne L. Williams, executrix

[73] Assignee: U.S. Philips Corporation, New York, N.Y.

[21] Appl. No.: 671,390

[22] Filed: Nov. 14, 1984

[30] Foreign Application Priority Data

Nov. 22, 1983 [NL] Netherlands .......................... 8304008

[51] Int. Cl.⁴ ............................................... H01S 3/19
[52] U.S. Cl. ........................................ 372/45; 357/17; 372/46
[58] Field of Search ................ 372/44, 45, 46; 357/17

[56] References Cited

FOREIGN PATENT DOCUMENTS 0225680 12/1983 Japan ...................................... 372/45
0023584 2/1984 Japan ...................................... 372/45

*Primary Examiner*—James W. Davie
*Attorney, Agent, or Firm*—Robert T. Mayer; Steven R. Biren

[57] ABSTRACT

In a semiconductor laser with iso-electronic doping or with a quantum-well structure, efficiency is considerably increased by lateral injection. For this purpose, the active region is composed of active layers and barrier layers which are laterally bounded by semiconductor zones preferably degenerate, which inject charge carriers in the longitudinal direction of the active layers. The population inversion in the active layers is further increased in that superinjection occurs at the transition with the degenerate zones.

8 Claims, 5 Drawing Figures

SEMICONDUCTOR LASER WITH LATERAL INJECTION

BACKGROUND OF THE INVENTION

The invention relates to a semiconductor device for producing electromagnetic radiation in an active layer-shaped semiconductor region, in which the active-region comprises at least one active layer or wire of a first semiconductor material between barrier layers of a second semiconductor material, the radiation recombination efficiency of the first semiconductor material being high with respect to that of the second semiconductor material.

Semiconductor devices for producing electromagnetic radiation are used in different fields. The present invention relates more particularly to semiconductor devices in which the radiation produced is coherent, so-called semiconductor lasers. The wavelength of the emitted radiation may then lie in the visible range of the spectrum, but, for example, also in the infrared or ultraviolet range.

Semiconductor devices having the features mentioned above result from the desire to manufacture semiconductor lasers having a shorter wavelength than the so-called double heterojunction (DH) lasers used most frequently hitherto, having a layer-shaped active region of, for example, gallium arsenide (GaAs) or gallium aluminum arsenide (AlGaAs) with a smaller energy gap lying between two oppositely doped passive coating layers of a material with an energy gap larger than that of the active material, such as gallium aluminum arsenide (AlGaAs7, in which the larger energy gap is due to a higher aluminum content.

The radiation produced by these known semiconductor lasers generally has (in air) a wavelength of 800 to 900 nm. For various reasons, it is desirable to manufacture lasers emitting radiation of a shorter wavelength. Thus, for example, when information is stored in image and sound carriers (VLP, DOR, compact disk), the required quantity of surface area for one bit of information is proportional to the square of the wavelength of the laser radiation. Consequently, when this wavelength is halved, it is possible to quadruple the information density. An additional advantage is that with shorter wavelengths a simple optical system is sufficient.

In semiconductor devices having the features mentioned above, various effects may occur in the layer structure of the active region, depending upon the construction of this layer structure. A first effect that may occur is the so-called "quantum-well effect".

The "quantum well" effect occurs when a very thin layer of a first semiconductor material is enclosed between two layers of a second semiconductor material with a larger energy gap than the first material. Consequently the effective energy gap in the very thin layer of the first material becomes larger and thus the wavelength of the radiation produced becomes shorter. One or more layers of the first semiconductor material may then be situated (in the active region) between the layers of the second semiconductor material. If the layers of the first semiconductor material lie very close to each other, the so-called "zone folding" effect may occur due to the fact that these layers constitute a superlattice structure. The "zone folding" effect occurs due to the superlattice structure and results in the conversion of "indirect" semiconductor material to effective "direct" semiconductor material with respect to the band transitions of charge carriers. Thus, the radiation transition probability of the charge carriers is increased so that a high radiation density can be attained. For a description of the "quantum well" effect, reference is made inter alia to the article of Holonyak et al in I.E.E.E. Journal of Quantum Electronics, Vol. GE 16, 1980, pages 170-184.

For a description of the "zone folding" effect, reference is made, for example, to the article of Osbourn et al in Applied Physics Letters, Vol. 41. (1982), p. 172-174.

Further, so-called "iso-electronic" doping may take place in the active layer, in which in a semiconductor device having the features described above the first semiconductor material is provided in the active region in the form of a wire or a layer, the dimensions of the wire or the layer, viewed in a direction at right angles to the wire or the layer, being at most equal to the thickness of two monomolecular layers of the first semiconductor material.

Such a semiconductor device is described in Dutch Patent Application No. 8301187 corresponding to U.S. Ser. No. 592,318, now abandoned.

In the laser structures described above, an active layer is located between two semiconductor layers or zones with a larger energy gap than the effective energy gap of the active region. Such passive semiconductor layers which serve to enclose the radiation produced to the greatest possible extent within the active layer have in such lasers the opposite conductivity type to the active layer and are moreover provided with electrodes. Via these electrodes, charge carriers are supplied, which in the active layer lead to the desired population inversion and hence to laser radiation.

Especially in those cases in which the active region has a "quantum well" structure or is obtained by iso-electronic doping, problems may arise because the injection of charge carriers takes place in a direction at right angles to the surfaces of active material having a high radiation recombination power. For a simple "quantum well" structure, this problem is indicated in the article "Very narrow graded barrier single quantum well lasers grown by metal-organic chemical vapour deposition" by D. Kasemset et al, published in "Applied Physics letters" 41 (10), Nov. 15, 1982, p. 912-914. The problem is that for the injected charge carriers, which have to cause population inversion in these layers, the trapping possibility is very small, notably when the layer thickness becomes smaller than the average free path length of the charge carriers in the relevant material (of the active layer).

For the configuration with a simple "quantum well" a solution is proposed in the aforementioned article in which the active layer is situated between two enclosing layers having a variation in the energy gap such that the enclosing layers exhibit over a distance of 220 nm a gradual increase of the energy gap. As a result, scattering of the charge carriers occurs and these carriers are trapped via recombination processes in the actual "quantum well". Thus, it is possible to obtain a simple "quantum well" laser having a width of the "quantum well" (in the case of gallium arsenide) of 75 nm.

In semiconductor lasers provided with isoelectronically doped active regions, the above problems are even more serious because here the active layers (or wires) have a thickness of at most two monomolecular layers and these structures have effectively to be considered as the unit-case of a "quantum well" structure.

SUMMARY OF THE INVENTION

According to the invention a semiconductor device having the features mentioned above is characterized in that the active region is bounded laterally on two sides by respective semiconductor regions of the second semiconductor material having respectively a first conductivity type and a second conductivity type opposite to the first conductivity type.

In operation of the device charge carriers are either injected directly into the active layers of the first semiconductor material which then leads to population inversion or they are injected into the passive layers of the second semiconductor material.

Due to the difference in radiation recombination efficiency, the charge carriers in the passive material of the barrier layers have a lifetime which is much longer (on the order of 1000 to 10,000 times longer) than in the active material. By a suitable choice of the distance between the adjoining semiconductor regions, a number of charge carriers, depending upon their lifetime and the operating conditions, will pass completely through the whole path through one of the barrier layers, but nevertheless a large number of these charge carriers are scattered by collision processes and other scattering processes to the active layers, where they recombine due to the much shorter lifetime at this area and emit the desired radiation. By contrast with the prior art, the charge carriers are injected laterally rather than at right angles to the layers of the active region, as a result of which the trapping possibility is increased. Consequently the device has a high efficiency because a larger number of injected charge carriers contribute to the population inversion in the active layers having a high recombination power.

As described above, lateral charge carrier injection is extremely effective in lasers of the "quantum well" type and in lasers in which the active region is obtained by means of iso-electronic doping.

A first preferred embodiment of a semiconductor device in accordance with the invention is characterized in that the active region has a layer structure comprising several active layers of the first semiconductor material having substantially equal thickness, which active layers are located between and are mutually separated by barrier layers of the second semiconductor material.

For satisfactory laser operation, it is necessary that the electromagnetic wave produced remains within the active region. For this purpose, this region is preferably situated between two regions having a lower refractive index. In order to contain the electromagnetic wave in lateral direction, the boundary semiconductor regions of the first and of the second conductivity type are preferably doped so highly that degeneration occurs. In this connection, the term "degeneration" is to be understood to mean that such a high impurity concentration is provided that the Fermi level has in the conduction band (n-type degeneration) or in the valence band (p-type degeneration). Due to the so-called "Burstein-shift", an effective reduction of the real part of the refractive index is consequently obtained in these regions. Moreover, the high doping of these regions gives rise to superinjection into the layers of the first semiconductor material, as a result of which a more rapid population inversion occurs.

In the longitudinal and transversal direction, the dimensions can be chosen so that an optimum laser effect is obtained. Thus, the thickness of the active region is preferably chosen to be equal to substantially 1/2 n times the emitted wavelength (n=refractive index of the second semiconductor material) because then the optical flux is amplified to the optimum, which results in an optimum efficiency.

BRIEF DESCRIPTION OF THE DRAWING

An embodiment of the invention will now be described, by way of example, with reference to the accompanying drawing, in which.

Figure 1:
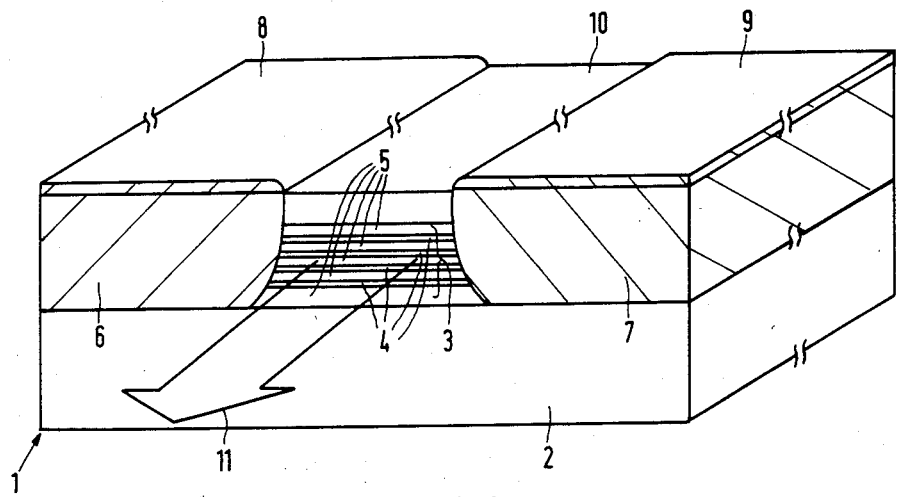
FIG. 1 shows diagrammatically a semiconductor device according to the invention.

The Figures are merely schematic and not drawn to scale, while for the sake of clarity particularly the dimensions in the direction of thickness are greatly exaggerated. Corresponding parts are generally designated by the same reference numerals. Semiconductor regions of the same conductivity type are hatched in the same direction.

DESCRIPTION OF THE PREFERRED EMBODIMENTS

FIG. 1 shows diagrammatically partly in sectional view and partly in perspective view a semiconductor laser comprising a semi-insulating substrate 2 of gallium phosphide having a thickness of about 80 $\mu$m and lateral dimensions of about 300 $\mu$m by about 250 $\mu$m. On this substrate is disposed an active region 3 having a width of about 2 $\mu$m and a length of about 250 $\mu$m. The active region 3 comprises in this case a multi-quantum-well structure and is composed alternately of active layers 4 with a small energy gap and barrier layers 5 with a large energy gap. In this example, the active layers comprise gallium phosphide and have a thickness of about 1 nm, while the barrier layers consist of aluminum phosphide and have a thickness of about 6 nm.

The active layers may even be so thin that they comprise only one or at most two monomolecular layers of gallium phosphide and have a thickness of at most 0.6 nm. In the latter case, a quantum-well structure no longer exists, but iso-electronic doping is effected, and is described more fully in the aforementioned Dutch Patent Application No. 8201187.

The active region 3 is bounded laterally by a first semiconductor region 6 of n-type aluminum phosphide and a second semiconductor region 7 of p-type aluminum phosphide. The two semiconductor regions are highly doped and are provided for further contacting with highly doped contact layers 8 (n-type) and 9 (p-type), respectively, of gallium phosphide. They preferably bound the region 3 throughout its thickness.

Moreover, the active region 3 is coated at its upper side with a protective layer 10 of boron nitride. The material of this layer 10 has a lower refractive index than that of the active region 3 and together with the semi-insulating substrate 2 constitute transverse boundaries of the resonant cavity in which the electromagnetic radiation is produced. The lateral modes of the radiation are limited in that the refractive index in the highly doped regions 6 and 7 is effectively reduced by the so-called "Burstein shift". Finally, in the longitudinal direction, the end faces of the active region 3 constitute semitransparent mirrors for the radiation produced so that this radiation leaves the laser 1 in a direction at right angles thereto. In FIG. 1, this is indicated diagrammatically by the beam 11. The wavelength of the radiation is about 530 nm. For optimum efficiency, a value of about 0.2 μm is chosen for the thickness of the region 3 (the refractive index of aluminum phosphide is about 2.8).

Figure 2:
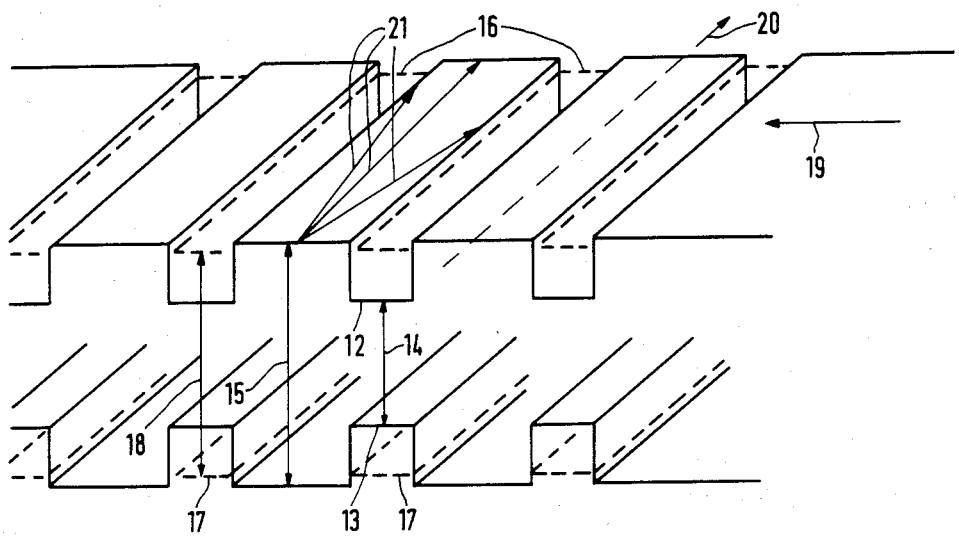
FIG. 2 shows diagrammatically a representation of the energy levels in the active region of the device shown in FIG. 1 with respect to the direction of the charge carrier transport.

With reference to FIG. 2, the advantages of this structure will now be described more fully. FIG. 2 shows an energy diagram of the active region 3, in which the energy levels of the charge carriers are plotted in a vertical direction. The variation of conduction band 12 and of the valence band 13, respectively, is plotted in a horizontal direction for a material composed of alternate semiconductor layers having different energy gaps corresponding to a composition similar to that of the active region 3 of the device shown in FIG. 1. The energy gaps 14 and 15 correspond to those of the active layers 4 of gallium phosphide and the barrier layers 5 of aluminum phosphide, respectively. The energy levels are shown as planes extending in a direction at right angles to the plane of the drawing, which is an indication that these planes (and the associated energy levels) extend throughout the length of the active region 3. For the sake of clarity, it is noted that the direction of the material variation in FIG. 2 has rotated through 90° with respect to that in FIG. 1.

The region 3 has a multi-quantum-well structure, and therefore, due to quantization effects energy states are created for the charge carriers (electrons, holes) in the planes 16 and 17 shown diagrammatically in the thin layers of gallium phosphide. The effective emitted electromagnetic radiation in such a region then has a wavelength corresponding to the associated effective energy gap 18 (see FIG. 2).

In order to obtain population inversion, charge carriers are injected into the active region. In lasers with such a quantum-well structure or with iso-electronic planes known hitherto, this injection was effected in a direction at right angles to the planes in which the quantization occurs (in this case the active layers 4). For the electrons this resulted, for example, in that they were injected in a direction indicated by the arrow 19 in FIG. 2. As already stated above, the possibility of trapping in the active layers 4 is very small.

In a semiconductor device in accordance with the invention, however, the electrons are injected in the direction of the arrow 20. The electrons not directly injected into the layers 4 then move, depending upon the average free path length, for a comparatively long time in the barrier layers along paths 21. They then have a lifetime of the order of 100 μsec in the indirect aluminum phosphide which has a low radiation recombination efficiency, while in the effectively direct gallium phosphide having a high radiation recombination efficiency this lifetime is of the order of a few tens of nanoseconds.

The distance between the semiconductor regions 6 and 7 (see FIG. 1) is chosen so that at the usual operating voltage it is approximately equal to or slightly less than the diffusion recombination length of the charge carriers in the indirect aluminum phosphide so that a large part of the electrons, when passing through the barrier layers, are scattered via various collision mechanisms (electronphonon interaction, scattering etc.) to the semiconductor layers of effective direct active gallium phosphide. These processes are effected within such a short time (on the order of picoseconds) that this is negligible with respect to the average lifetime of the charge carriers both in the aluminum phosphide and in the gallium phosphide. A similar consideration holds for the holes injected into the active region 3 as for the electrons. When in the manner shown, the charge carriers are effectively injected laterally, population inversion of electrons and holes occurs in the quantized planes 16, 17.

Population inversion is also obtained because the phenomenon of superinjection occurs at the interface between the active layers 4 and the semiconductor regions 6, 7. Thus, for example, the interface between the semiconductor region 6 and an active layer 4 forms a heterojunction between a material having a large energy gap and a material having a small energy gap. When a forward voltage is applied across such a heterojunction, the quasi Fermi level in the active material 4 rises (at least over a short distance) above the lower side of the conduction band, which consequently leads locally to population inversion. A similar consideration holds for the injection of holes via the hereto-junction between the p-type region 7 and the active layers 4. For a further explanation of the phenomenon of superinjection, reference may be made to L. J. v. Ruyven "Phenomena at hetero-junctions", published in Annual Review of Materials Science, Vol. 2, 1972, p.501–528, more particularly p. 424–525.

Due to the high doping with impurities of the regions 6 and 7, an increase of the effective energy gap and hence a reduction of the refractive index occurs here. This so-called "Burstein shift" is explained in Chapter 7.1a of Semiconducting III-V Compounds, Vol. 1, by C. Hilsum and A. C. Rose-Innes, more particularly pages 173–174. Due to the lower refractive index in the regions 6 and 7, the resonant cavity for the electromagnetic radiation produced is limited in lateral direction.

Figure 3:
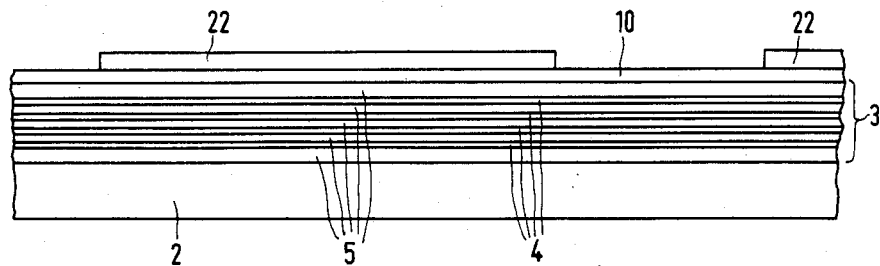
FIGS. 3 to 5 show diagrammatically in sectional view the device shown in FIG. 1 at different stages of its manufacture.
Figure 4:
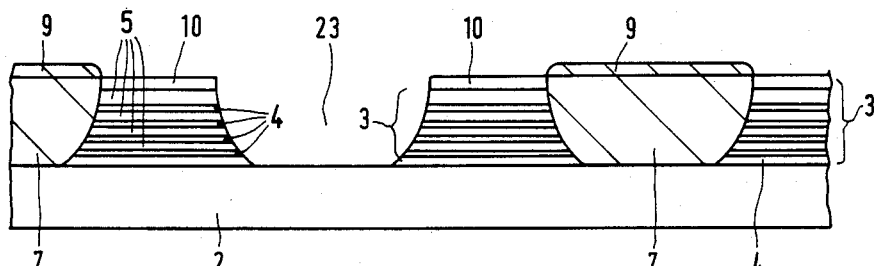

A plurality of semiconductor lasers as described with reference to FIG. 1 can be manufactured as follows (see FIGS. 3 to 5).

The starting material is a semi-insulating gallium phosphide substrate 2, on which are grown for the active regions 3 alternately barrier layers 5 of aluminum phosphide and active layers 4 of gallium phosphide, for example, by means of molecular beam epitaxy or by means of metallo-organic vapor phase epitaxy (MOVPE technique) until the active region has reached the desired thickness (in this example about 0.2 μm). Subsequently, the whole is covered with a coating layer 10 of boron nitride. This material can be applied by similar techniques. Thus, the situation shown in FIG. 3 is obtained.

At regular distances, the protective layer 10 and parts of the active region 3 are then removed. First a photolithographic mask 22 is used for etching the boron nitride layer 10. Both the parts of the semiconductor surface exposed by etching and the remaining strip of the layer 10 have a width of about 300 μm.

After the active region 3 has been removed by etching at the area of the openings in the layer 10, highly doped p-type aluminum phosphide is grown in the grooves thus obtained by means of, for example, molecular beam epitaxy for forming the highly doped (degenerate) regions 7. For satisfctory contacting, these regions 7 are coated, also by means of molecular beam epitaxy, with highly conductive p-type gallium phosphide regions 9.

Subsequently, with the use of a second mask, the grooves 23 are etched in a manner such that they have a width of about 300 μm and the intermediate remaining active regions 3 have a width of about 2 μm (see FIG. 4). The grooves 23 are now filled again in a similar manner as described above with highly doped n-type (degenerate) aluminum phosphide 6 and gallium phosphide 8. Thus, the device of FIG. 5 is obtained.

Figure 5:
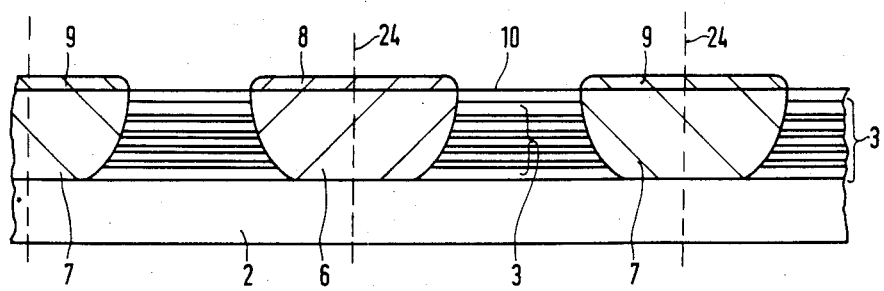

Now one strip of the active region 3 having a width of about 2 μm laterally limited by highly doped regions 6 and 7 is situated between each pair of broken lines 24 shown in FIG. 5. Depending upon the size of the substrate 2 constituting the starting material, several lasers 1 of the kind shown in FIG. 1 can be obtained therefrom by scribing and breaking along planes in the direction of the broken lines 24 at right angles to the plane of the drawing and along planes parallel to the plane of the drawing.

Of course, the invention is not limited to the embodiment described above, but various modifications are possible for those skilled in the art without departing from the scope of the invention. For example, depending upon the desired wavelength, other combinations of materials in the active region may be used, such as, for example, gallium nitride between gallium phosphide layers as barrier layers or gallium arsenide between aluminum arsenide as barrier layers. Furthermore, other materials may be chosen for the protective layer 10, such as, for example, silicon oxide or silicon nitride.

What is claimed is:

1. In a semiconductor device for producing electromagnetic radiation and comprising an active layer-shaped semiconductor region in which the electromagnetic energy is produced, said active region comprising at least one active layer of a first semiconductor material and barrier layers of a second semiconductor material, said active layer being located between said barrier layers, the radiation recombination efficiency of the first semiconductor material being higher than that of the second semiconductor material, said device further comprising two semiconductor regions of the second semiconductor material having, respectively, a first conductivity type and a second conductivity type opposite to the first conductivity type, said active region being bounded laterally on two sides by said two semiconductor regions.

2. A semiconductor device as claimed in claim 1, characterized in that the active region is bounded throughout its thickness by the semiconductor regions of the second semiconductor material.

3. A semiconductor device as claimed in claim 1 or 2, characterized in that the active region has a layer structure comprising several active layers of the first semiconductor material having substantially equal thicknesses, and a plurality of barrier layers of the second semiconductor material, said active layers being located between and being mutually separated by said barrier layers.

4. A semiconductor device as claimed in claim 1 or 2, charcterized in that the semi-conductor regions of the second semiconductor material laterally bounding the active region have such a doping that degeneration occurs.

5. A semiconductor device as claimed in claim 1 or 2, characterized in that the semi-conductor regions of the second semiconductor material of the first and the second conductivity type respectively are covered with a contact layer of the first semiconductor material.

6. A semiconductor device as claimed in claim 1 or 2, characterized in that the active region has a thickness of substantially 1/2 n times the wavelength of the emitted electromagnetic radiation, n being the refractive index of the material of the barrier layers.

7. A semiconductor device as claimed in claim 1 or 2, charcterized in that the active layers comprise gallium phosphide and the barrier layers comprise aluminum phosphide.

8. A semiconductor device as claimed in claim 7, characterized in that the active region has a thickness of substantially 0.2 μm.

* * * * *